United States Patent
Kurose et al.

(10) Patent No.: US 7,088,278 B2
(45) Date of Patent: Aug. 8, 2006

(54) MULTIPLE INPUT ANALOG-TO-DIGITAL CONVERSION APPARATUS AND RADIO RECEIVER USING THE SAME

(75) Inventors: Daisuke Kurose, Kawasaki (JP); Takafumi Yamaji, Yokohama (JP); Tetsuro Itakura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/088,077

(22) Filed: Mar. 23, 2005

(65) Prior Publication Data

US 2005/0219101 A1     Oct. 6, 2005

(30) Foreign Application Priority Data

Mar. 30, 2004   (JP)  ............... 2004-101113

(51) Int. Cl.
    *H03M 1/12*      (2006.01)
(52) U.S. Cl. .................. 341/155; 341/161; 341/118
(58) Field of Classification Search ................ 341/155, 341/156, 161, 159, 126, 122, 118, 129, 143, 341/120, 172
See application file for complete search history.

(56) References Cited

U.S. PATENT DOCUMENTS

| | | | | |
|---|---|---|---|---|
| 6,195,032 B1 * | 2/2001 | Watson et al. | ............... | 341/162 |
| 6,288,663 B1 * | 9/2001 | Hester et al. | ................ | 341/155 |
| 6,295,016 B1 * | 9/2001 | Chiang | ........................ | 341/161 |
| 6,320,530 B1 * | 11/2001 | Horie | .......................... | 341/163 |
| 6,337,651 B1 * | 1/2002 | Chiang | ........................ | 341/161 |
| 6,359,579 B1 * | 3/2002 | Chiang | ........................ | 341/155 |
| 6,369,744 B1 * | 4/2002 | Chuang | ....................... | 341/161 |
| 6,600,440 B1 * | 7/2003 | Sakurai | ....................... | 341/172 |
| 6,744,395 B1 * | 6/2004 | Perelman et al. | ........... | 341/161 |
| 6,839,016 B1 * | 1/2005 | Roza | ........................... | 341/161 |
| 6,859,158 B1 * | 2/2005 | Wada et al. | ................. | 341/155 |
| 2005/0116846 A1 * | 6/2005 | Bogner | ........................ | 341/118 |

OTHER PUBLICATIONS

Sumanen et al., A 10 bit 200 MS/s CMOS Parallel Pineline A/D Converter, Jul. 2001, IEEE Journal of Solid State Circuit, vol. 36, No. 7, pp. 1048-1055.*

(Continued)

*Primary Examiner*—Linh Nguyen
(74) *Attorney, Agent, or Firm*—Amin & Turocy, LLP (57) ABSTRACT

A multiple input AD conversion apparatus includes a first unit AD converter including a plurality of first conversion stages connected in cascade to convert a first analog input signal to a first digital output signal, a second unit AD converter including a plurality of second conversion stages connected in cascade to convert a second analog input signal to a second digital output signal, and an operational amplifier shared between the first conversion stage and the second conversion stage in a time sharing.

10 Claims, 9 Drawing Sheets

OTHER PUBLICATIONS

David W. Cline, et al., A Power Optimized 13-b 5 Msamples/s Pipelined Analog-to-Digital Converter in 1.2 um CMOS, IEEE Journal of Solid-State Circuits, vol. 31, No. 3, Mar. 1996.

Byung-Moo Min, et al., A 69mW 10b 80MS/s Pipelined CMOS ADC, IEEE International Solid-State Circuits Conference, Digest of Technical Papers, pp. 324-325, 2003, no month.

Notification for Reasons for Rejection for Japanese Patent Application No. 2004-101113, Date of Mailing Sep. 27, 2005.

Sumanen, et al., A 10-bit 200-MS/s CMOS Parallel Pipeline A/D Converter, IEEE Journal of Solid-State Circuits, Jul. 2001, vol. 36, No. 7, pp. 1048-1055, USA.

* cited by examiner

MULTIPLE INPUT ANALOG-TO-DIGITAL CONVERSION APPARATUS AND RADIO RECEIVER USING THE SAME

CROSS-REFERENCE TO RELATED APPLICATIONS

This application is based upon and claims the benefit of priority from prior Japanese Patent Application No. 2004-101113, filed Mar. 30, 2004, the entire contents of which are incorporated herein by reference.

BACKGROUND OF THE INVENTION

1. Field of the Invention

The present invention relates to a multiple input analog-to-digital conversion apparatus that converts multiple input analog signals such as two or more input analog signals to a digital signal, and a radio receiver using the same.

2. Description of the Related Art

A pipeline AD (analog-to-digital) converter is known as an AD converter realizing an analog-to-digital conversion at the high speed such as several hundred mega samples per second and a high accuracy more than 10 bits. The pipeline AD converter has a sub ADC (sub AD Converter) and MDAC (Multiplying DA Converter) in a plurality of conversion stages arranged in cascade, outputs MSB (Most Significant Bit) of a digital output signal from a first conversion stage and sequentially outputs lower order bits than the digital output signal on and after a second stage. Since the error of the sub ADC is corrected by a digital correction circuit, the precision of the MDAC having an operational amplifier, a capacitor and a MOS transistor switch is determined by precision of the pipe line AD converter.

The operational amplifier used for the pipeline AD converter needs a high-speed and a high accuracy for the AD converter to operate at high speed. Accordingly, the operational amplifier has a large power consumption in the pipeline AD converter which occupies a considerable ratio to the power consumption of the whole AD converter.

Because the pipe line AD converter outputs a higher order bit in the previous conversion stage, the precision required for each conversion stage is alleviated according to the order of decreasing stage. A method of decreasing an area and power consumption of the operational amplifier according to the order of decreasing stage by alleviating the precision required for each conversion stage is proposed by the non-patent literature 1 (D. W. Cline et al, IEEE J. Solid State Circuits, vol. 31, no. 3, pp. 294–303, March 1996). This is a typical design technique of a lower consumption pipeline AD converter.

The non-patent literature 2 (B. M. Min et al, IEEE International Solid-State Circuit Conference Digest of Technical Papers pp. 324–325, 2003) provides a technique of reducing the number of necessary operational amplifiers to one-half by sharing an operational amplifier between adjacent conversion stages in a time sharing every half clock to realize further decreased power consumption of the pipeline AD converter. Such technique of sharing the operational amplifier in a time sharing utilizes that each of the adjacent conversion stages of the pipe line AD converter is in an active state every half clock.

The technique of sharing an operational amplifier between adjacent conversion stages in a time sharing cannot use an optimum operational amplifier on each conversion stage. In the case that an operational amplifier is shared between an N-th conversion stage and a (N+1)-th conversion stage in a time sharing, if the operational amplifier is optimized for the N-th conversion stage, the (N+1)-th conversion stage increases in power consumption and area more than necessary. Accordingly, according to the technique of the non-patent literature 1, the number of operational amplifiers decreases to one-half, but the power consumption is reduced only as much as 20–30%.

A plurality of AD converters are often used for subjecting to analog-to-digital conversion orthogonal modulation/demodulation signals or received signals from a plurality of receiving antennas in communications use such as a radio receiver. Accordingly, low power consumption of the AD converter is strongly required, and a solution is expected.

It is an object of the present invention to provide a multiple input analog-to-digital conversion apparatus which can realize lower power consumption than a conventional pipeline AD converter with respect to input analog signals of a plurality of channels.

It is another object of the present invention to provide a radio receiver of low power consumption by means of a multiple input analog-to-digital conversion apparatus.

BRIEF SUMMARY OF THE INVENTION

An aspect of the present invention provides a multiple input AD conversion apparatus which converts a first analog input signal and a second analog input signal to a first digital output signal and a second digital output signal respectively, the multiple input AD conversion apparatus comprises: a first unit AD converter including a plurality of first conversion stages connected in cascade to convert the first analog input signal to the first digital output signal; a second unit AD converter including a plurality of second conversion stages connected in cascade to convert the second analog input signal to the second digital output signal; and an operational amplifier shared between the first conversion stage and the second conversion stage in a time sharing.

Another aspect of the present invention provides a multiple input AD conversion apparatus which converts a first analog input signal and a second analog input signal to a first digital output signal and a second digital output signal respectively, the multiple input AD conversion apparatus comprises: a first unit AD converter including a first sample-and-hold circuit to sample and hold the first analog input signal and a plurality of first conversion stages connected in cascade to a rear stage of the first sample-and-hold circuit to convert the first analog input signal to the first digital output signal; a second unit AD converter including a second sample-and-hold circuit to sample and hold the second analog input signal and a plurality of second conversion stages connected in cascade to a rear stage of the second sample-and-hold circuit, and converts the second analog input signal to the second digital output signal; a first operational amplifier shared between the first conversion stage and the second conversion stage in a time sharing; and a second operational amplifier shared between the first sample-and-hold circuit and the second sample-and-hold circuit in a time sharing.

DETAILED DESCRIPTION OF THE INVENTION

There will now be described embodiments of the present invention in conjunction with accompanying drawings.

First Embodiment

Figure 1:
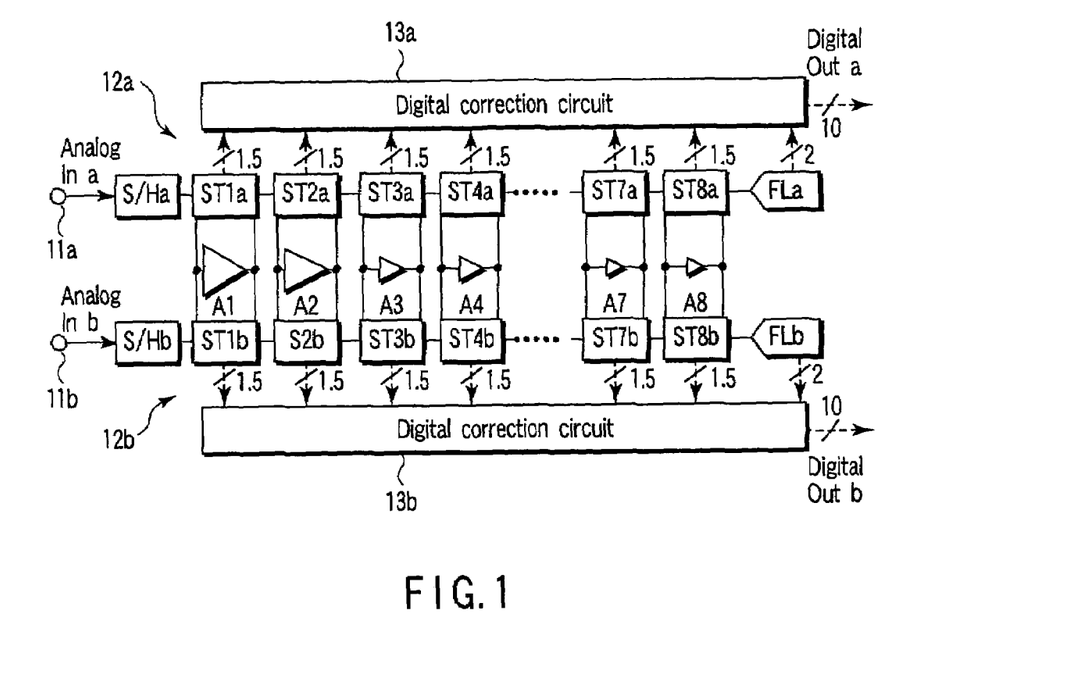
FIG. 1 is a block diagram of a multiple input analog-to-digital conversion apparatus concerning the first embodiment of the present invention.

FIG. 1 shows a multiple input analog-to-digital conversion apparatus concerning a first embodiment of the present invention. There will be described the multiple input analog-to-digital conversion apparatus using two pipeline AD converters each having a 10 bits output as the whole, with a 1.5 bits output per one conversion stage as a unit AD converter. The present invention is applicable to an apparatus wherein the number of output bits of each conversion stage exceeds 1.5 bits, and an apparatus wherein the multiple input analog-to-digital conversion apparatuses has three or more inputs. In the first embodiment, paying attention to that an operational amplifier used for each stage operates only at a half clock period, it is shared between two unit AD converters in a time sharing every half clock period.

The analog-to-digital conversion apparatus of FIG. 1 is described in detail. An analog input signal Analog In a input to the first input terminal $11a$ is input to the first unit AD converter $12a$, and an analog input signal Analog In b input to the second input terminal $11b$ is input to the second unit AD converter $12b$. The first unit AD converter $12a$ and the second unit AD converter $12b$ are pipeline AD converters. The first unit AD converter $12a$ comprises a sample-and-hold circuit S/Ha arranged on an input stage, a plurality of conversion stages $ST1a$–$ST8a$ cascade-connected to the rear stage of the sample-and-hold circuit S/Ha, a flash AD converter (referred to as a sub ADC) Fa connected to the rear stage of the last conversion stage $ST8a$, and a digital correction circuit $13a$.

The second unit AD converter $12b$ comprises a sample-and-hold circuit S/Hb arranged on the input stage, a plurality of conversion stages $ST1b$–$ST8b$ cascade-connected to the rear stage of the sample-and-hold circuit S/Hb, a flash AD converter (referred to as a sub ADC) Fb connected to the rear stage of the last conversion stage $ST8b$, and a digital correction circuit $13b$.

Operational amplifiers A1–A8 are shown outside the conversion stages $ST1a$–$ST8a$ and $ST1b$–$ST8b$ in FIG. 1, but they are parts of the components of the conversion stages $ST1a$–$ST8a$ and $ST1b$–$ST8b$. In other words, each operational amplifier is fabricated integrally with corresponding conversion stages. The operational amplifiers A1–A8 are shared between the conversion stages $ST1a$–$ST8a$ and the conversion stages $ST1b$–$ST8b$ in a time sharing every half clock. The clock is a sampling clock supplied to the sample-and-hold circuits S/Ha and S/Hb. Although not shown, the conversion stages $ST1a$–$ST8a$ and $ST1b$–$ST8b$ include switches, for example, MOS transistor switches for connecting the operational amplifiers A1–A8 to the conversion stages $ST1a$–$ST8a$ or the conversion stages $ST1b$–$ST8b$.

According to the above non-patent literature 1, paying attention to that the precision necessary for each conversion stage is relaxed toward the rear stage, the area and power consumption of the operational amplifier decrease toward the rear stage. The similar conception is applied to the present embodiment. In other words, the area and power consumption of the operational amplifiers A1–A8 are decreased toward the rear stage of the conversion stages $ST1a$–$ST8a$ and $ST1b$–$ST8b$. The dimension of each of symbols representing the operational amplifiers A1–A8 respectively shows schematically the ratio of the area (transistor size) of each amplifier to that of another amplifier and the ratio of the power consumption to that of another amplifier.

The basic operation of the analog-to-digital conversion apparatus of FIG. 1 will be described. Because the operations of two unit AD converters $12a$ and $12b$ are completely similar, the operation of the unit AD converter $12a$ is described. The analog input signal Analog In a input to the input terminal $11a$ is sampled and held by the sample-and-hold circuit S/Ha, that is, sampled according to a sample hold clock and held during a given time interval. The analog signal output by the sample-and-hold circuit S/Ha is input into a plurality of conversion stages $ST1a$–$ST8a$.

The conversion stages $ST1a$–$ST8a$ convert the analog signals input thereto into digital signals each having the relatively small number of bits, for example, 1.5 bits, and output an analog residual signal indicating a conversion error of the converted digital signal. The residual signals output by the conversion stages $ST1a$–$ST7a$ are input to following conversion stages $ST2a$–$ST8a$ respectively. The residual signal output by the last conversion stage $ST8a$ is converted to a digital signal by means of a sub ADCFa of 2 bits, for example.

The digital signals output by the conversion stages $ST1a$–$ST8a$ and sub ADCFa are mixed by the digital correction circuit $13a$, and corrected as described hereinafter to generate a digital output signal Digital Out a of high resolution, for example, 10 bits. The digital signal output by the head conversion stage $ST1a$ is MSB of the digital output signal Digital Out a (a most significant bit). The digital signal output by the sub ADCFa for subjecting a residual signal output by the last conversion stage $ST8a$ to AD conversion is LSB (least significant bit) of the digital output signal Digital Out a.

The digital signals output by the conversion stages ST1a–ST8a and sub ADCFa each have a relative delay time with respect to the analog signal (sample hold value) output by the sample-and-hold circuit S/Ha, the relative delay time corresponding to a total of the delay times of the conversion stages from the sample-and-hold circuit to each of the conversion stages. Accordingly, the digital correction circuit 13a must mix the digital signals after the relative delay time is compensated.

Figure 2:
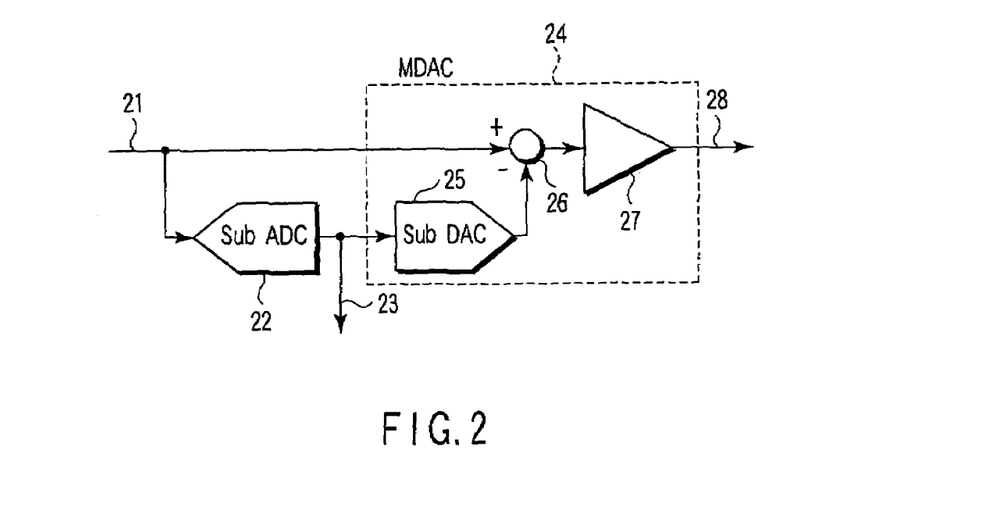
FIG. 2 is a block diagram of an operative example of one conversion stage.

FIG. 2 shows a configuration of one of the conversion stages ST1a–ST8a. To the conversion stage is input an analog signal 21 output by the sample-and-hold circuit S/Ha or the preceding conversion stage. At first, the input analog signal 21 is converted into a digital signal 23 of the relatively small number of bits by the sub ADC 22. The digital signal 23 output by the sub ADC 22 is input to the digital correction circuit 13a and MDAC (Multiplying DA Converter) 24. Two paths (2 bits) are used for the digital signal 23 output by the sub ADC 22, but the value used actually is not quaternary ($=2^2$) but ternary. For this reason, the conversion stage as shown in FIG. 2 is conventionally called a 1.5 bits/stage.

The MDAC 24 is a DA converter having a sub DAC 25, a subtracter 26 and an operational amplifier 27. The digital signal 23 from the sub ADC 22 is converted into an analog signal by the sub DAC 25, and a difference signal between the analog signal and the analog signal 21 input to the conversion stage is calculated by the subtracter 26. The difference signal (called a residual signal) output by the subtracter 26 is amplified by the operational amplifier 27. The residual signal 28 output from the operational amplifier 27 is supplied to the following conversion stage. The operational amplifier 27 corresponds to each of the operational amplifiers A1–A8 shown in FIG. 1.

In the case of the pipeline AD converter using such 1.5 bits/stage for the conversion stages ST1a–ST8a, the digital correction circuit 13a corrects an offset of a comparator in the sub ADC in each stage as a redundant bit of 0.5 bit. Such a digital correction circuit is described by, for example, Stephen H. Lewis, H. Scott Fetterman, George F. Gross, Jr., R. Ramanchandran, and T. R. Viswanathan "A 10-b 20-M sample/s Analog-to-Digital Converter", IEEE JOURNAL OF SOLID-STATE CIRCUITS, VOL. 27, NO. 3, MARCH 1992.

In this way, according to the first embodiment, the operational amplifiers A1–A8 are shared in a time sharing between each of the conversion stages ST1a–ST8a in the first unit AD converter 12a and each of the conversion stages ST1b–ST8b in the second unit AD converter 12b. Accordingly, the number of necessary operational amplifiers and the area thereof are reduced by one-half in comparison with a case without sharing, resulting in that the whole area for the analog-to-digital conversion apparatus and power consumption thereof are decreased. Although the first embodiment 2 is a two-input analog-to-digital conversion apparatus, it is clear that the number of operational amplifiers decreases as the number of inputs increase, resulting in decreasing the area for the operational amplifiers and power consumption thereof.

Second Embodiment

Figure 3:
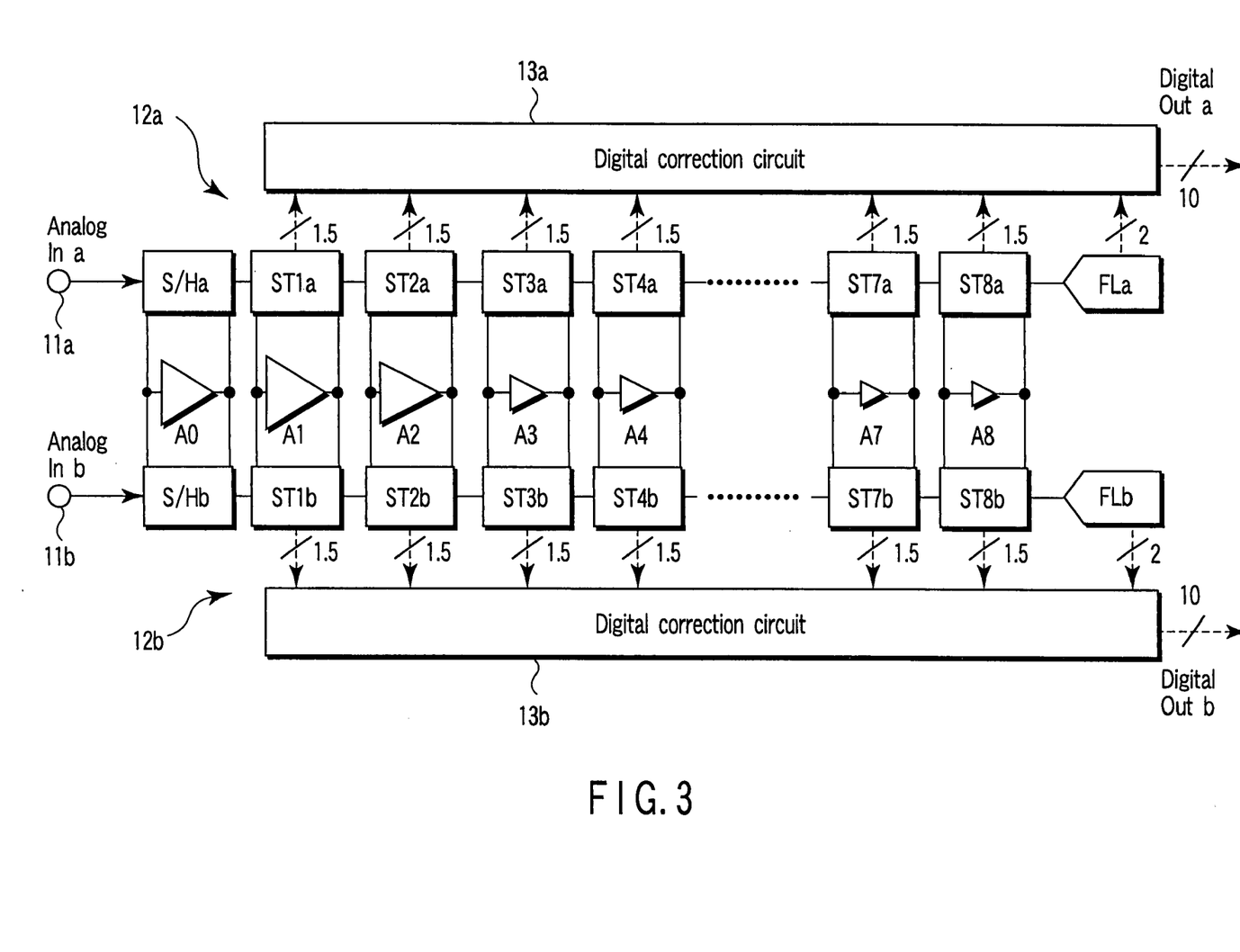
FIG. 3 is a block diagram of a multiple input analog-to-digital conversion apparatus concerning the second embodiment of the present invention.

In an analog-to-digital conversion apparatus concerning the second embodiment of the present invention, operational amplifiers A1–A8 are shared in a time sharing between each of conversion stages ST1a–ST8a and each of conversion stages ST1b–ST8b similarly to the first embodiment as shown in FIG. 3. Further, an operational amplifier A0 is shared in a time sharing between a sample-and-hold circuit S/Ha in the first unit AD converter 12a and a sample-and-hold circuit S/Hb in the second unit AD converter 12b.

In other words, the sample-and-hold circuit includes an operational amplifier and operates only a period for a half clock as an operational amplifier, so that a single operational amplifier A0 is shared between a sample-and-hold circuit S/Ha and a sample-and-hold circuit S/Hb in a time sharing. The operational amplifier A0 is written separately as the sample-and-hold circuits S/Ha and S/Hb in FIG. 3. However, it is a part of the components of the sample-and-hold circuits S/Ha and S/Hb. In other words, the operational amplifier is fabricated integrally with the sample-and-hold circuits S/Ha and S/Hb.

Because the sample-and-hold circuits S/Ha and S/Hb must be held to a noise level of 10-bits precision, a load capacity (sampling capacity of conversion stages 1a and 1b) increases. Accordingly, the sample-and-hold circuits S/Ha and S/Hb need a large power operational amplifier that can drive a load of large capacity, so that it is available for power consumption reduction to share a single operational amplifier A0 between the sample-and-hold circuits S/Ha and S/Hb.

Figure 4:
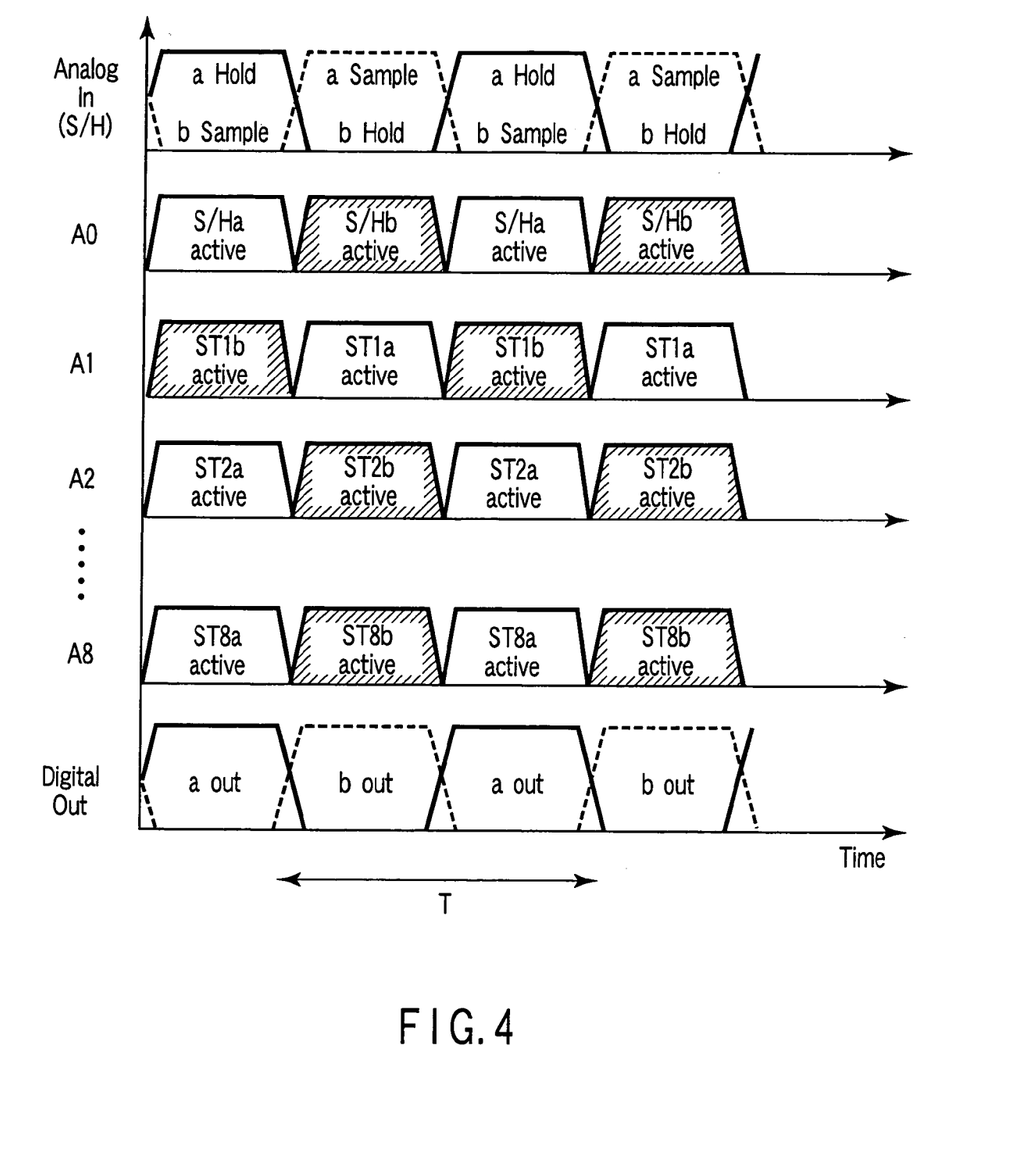
FIG. 4 is a timing diagram of the multiple input analog-to-digital conversion apparatus of FIG. 2.

The detailed operation of the multiple input AD conversion apparatus of FIG. 3 will be described by a timing chart of FIG. 4.

The sample-and-hold circuits S/Ha and S/Hb perform alternately sampling and holding in cycle T of a sampling clock. The control circuit controls the sample-and-hold circuits S/Ha and S/Hb so that one of them is a sampling state while the other a holding state. The operational amplifier A0 is always in active state (Active), and controlled to be used alternatively between sample-and-hold circuits S/Ha and S/Hb every half clock. The sample-and-hold circuit S/Ha samples an analog signal Analog In a in a period during which the operational amplifier A0 is not used as the sample-and-hold circuit S/Ha. On the other hand, the sample-and-hold circuit S/Hb samples the input analog signal Analog In b in the period when the operational amplifier A0 is not used in the sample-and-hold circuit S/Hb.

The operational amplifiers A1 to A8 are shared between each of the conversion stages ST1a to ST8a and each of the conversion stages ST1b to ST8b in a time sharing as explained in the first embodiment. More specifically, each of the conversion stages ST1a to ST8a and each of the conversion stages ST1b to ST8b are alternately make in active state. When the conversion stage ST8a of the last conversion stages ST8a and ST8b is in active state, the digital output signal Digital Out a is output by the first unit AD converter 12a. When the conversion stage ST8b is in active state, the digital output signal Digital Out b is output by the second unit AD converter 12b.

Third Embodiment

In the second embodiment, the operational amplifiers A0, A1 to A8 are shared between the first unit AD converter 12a and the second unit AD converter 12b in a time sharing every half clock period T/2. Accordingly, as shown in FIG. 4, the timing for sampling the analog input signals Analog In a and Analog In b respectively are shifted by a half clock period T/2, so that the output timings of the digital output signals Digital Out a and Digital Out b, too are shifted by a half clock period T/2.

Figure 5:
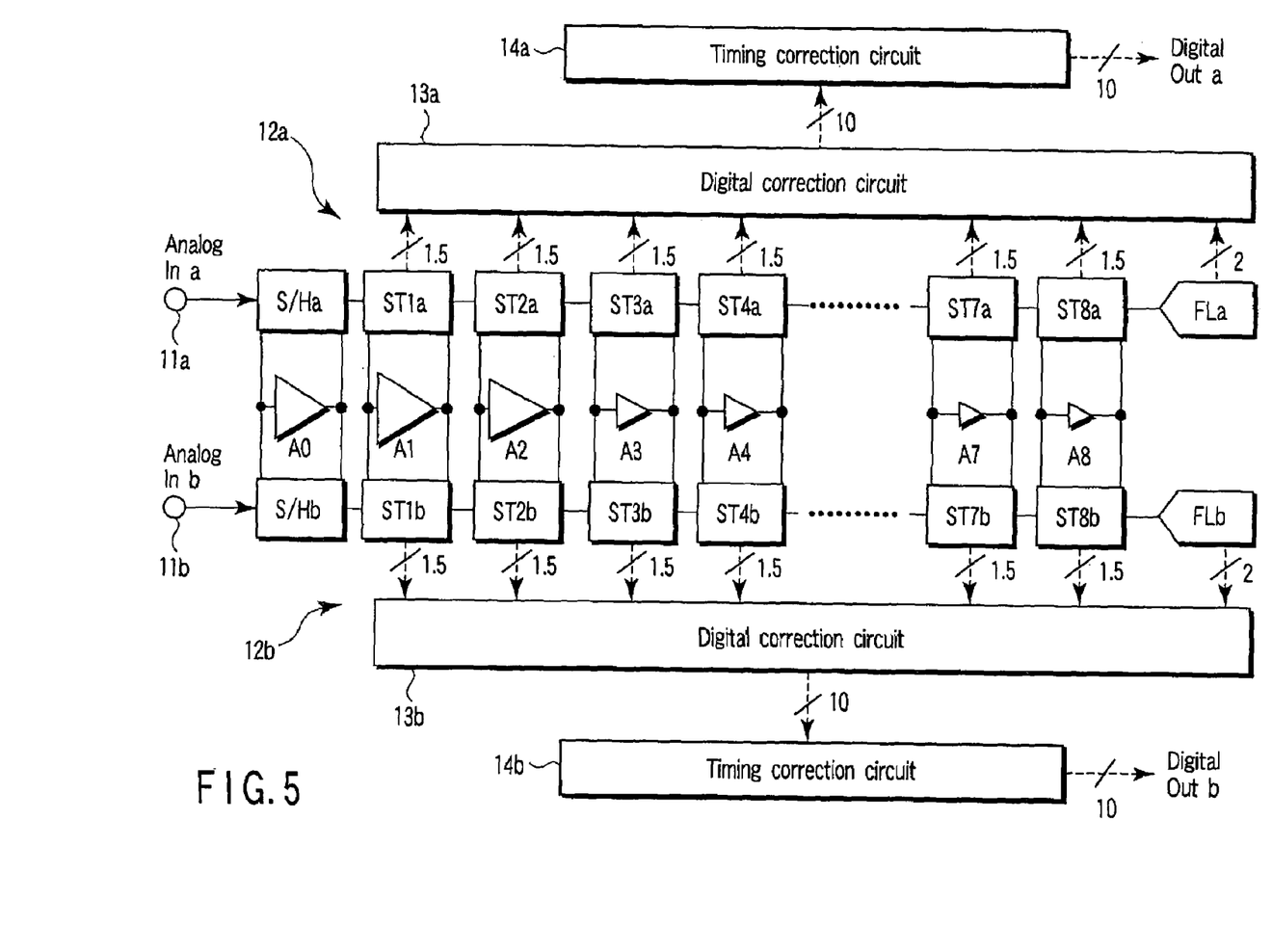
FIG. 5 is a block diagram of a multiple input analog-to-digital conversion apparatus concerning the third embodiment of the present invention.

In this way when deviation between the output timings of the digital output signals from the first and second unit AD converters 12a and 12b becomes a problem. In the multiple input AD conversion apparatus of the third embodiment, timing correction circuits 14a and 14b to correct deviation between the output timings as shown in FIG. 5 are arranged on the rear stages of the digital correction circuits 13a and 13b, respectively. The timing correction circuits 14a and 14b can provide the digital output signals Digital Out a and Digital Out b that a timing deviation of a half clock period T/2 therebetween is corrected, by adding a time difference of the half clock period T/2 between the digital output signals output from the digital correction circuits 13a and 13b respectively, Fourth Embodiment When one of the digital output signals output from the digital correction circuits 13a and 13b, for example, is delayed by half clock period T/2 by the timing correction circuits 14a explained in the third embodiment, the deviation between the output timings of the digital output signals Digital Out a and Digital Out b which are finally provided is corrected. However, each delay time of the digital output signals Digital Out a and Digital Out b (a delay time from each of the input terminals 11a and 11b to each of the output terminals of the timing correction circuits 14a and 14b) is shifted by the half clock period T/2.

Figure 6:
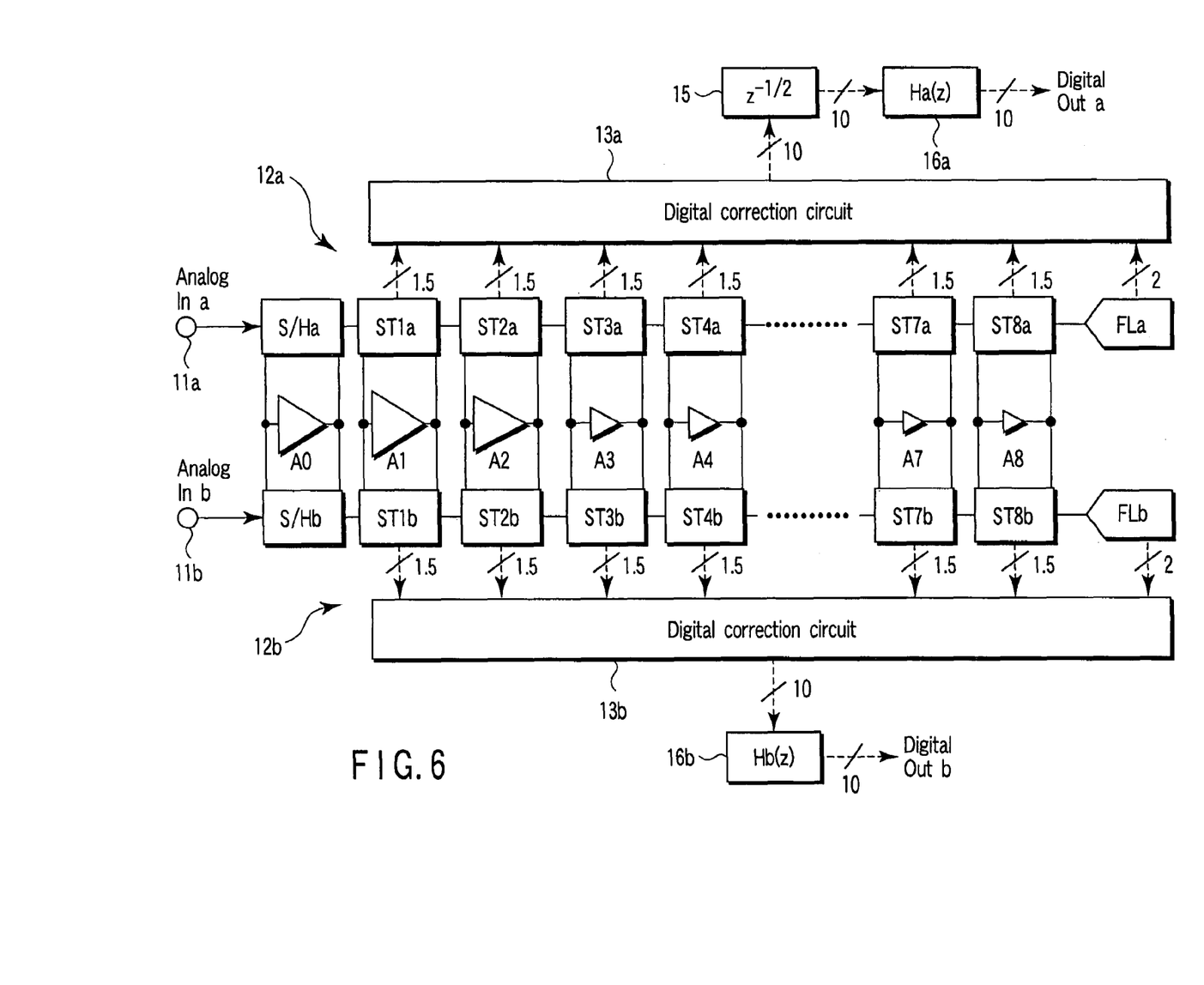
FIG. 6 is a block diagram of a multiple input analog-to-digital conversion apparatus concerning the fourth embodiment of the present invention.

In the fourth embodiment of the present invention, the deviation (i) between the output timings of the digital output signals Digital Out a and Digital Out b and the relative deviation (ii) between the delay times can be corrected as follows. As shown in FIG. 6, in the multiple input AD conversion apparatus related to the fourth embodiment, the delay circuit 15 and the digital filter 16a are connected in cascade to the output side of the digital correction circuit 13a, and similarly the digital filter 16b is connected to the output side of the digital correction circuit 13b. The delay circuit 15 and the digital filter 16a correspond to the timing correction circuit 14a in FIG. 5. The digital filter 16b corresponds to the timing correction circuit 14b in FIG. 5. The delay circuit 15 has a delay time of the half clock period T/2 as being apparent from description of $z^{-1/2}$. Accordingly, the delay circuit 15 corrects the deviation of the half clock period T/2 between the output timings of the digital output signals Digital Out a and Digital Out b, that is, the deviation (i).

The digital filters 16a and 16b use a FIR (Finite Input Response), for example. The number of taps of the digital filter 16a is n, and the number of taps of the digital filter 16b is n−1. A tap coefficient is set so that the digital filters 16a and 16b have the same impulse response. In this way if one of the taps of the digital filters 16a and 16b is caused to differ from the other and impulse responses thereof are caused to be the same, the relative deviation between the delay times of the digital output signals Digital Out a and Digital Out b, that is, the deviation (ii) can be corrected.

Figure 7:
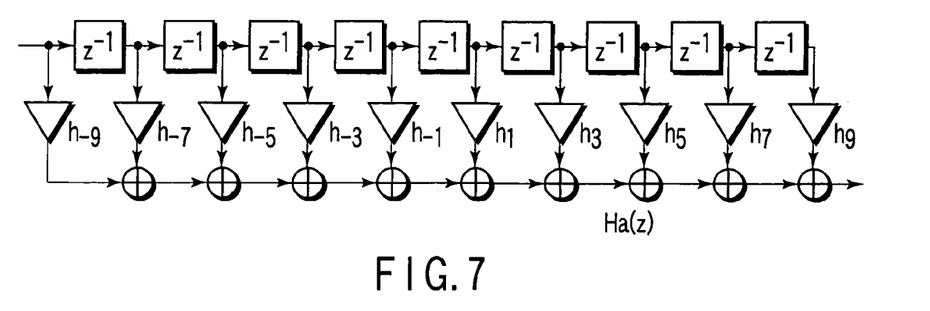
FIG. 7 is a block diagram of a first digital filter shown in FIG. 6.
Figure 8:
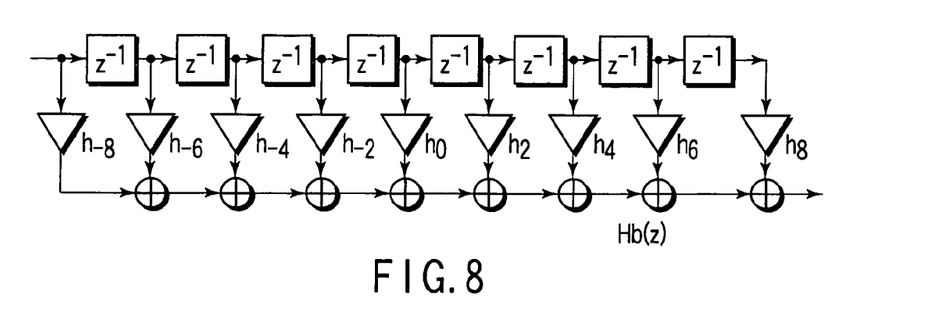
FIG. 8 is a block diagram of a second digital filter shown in FIG. 6.

FIGS. 7 and 8 show concrete examples of the digital filters 16a and 16b which are FIR filters.

With a plurality of unit delay elements expressed with $z^{-1}$ which are connected in cascade to one another, the digital filter 16a has the even number of taps (10 taps in an example of FIG. 7), and the digital filter 16b has the odd number of taps (9 taps in an example of FIG. 8). In other words, this example is n=10. A signal is input to a unit delay element of an initial stage, and each tap to which a tap coefficient hx is given is added to the signal to produce a filtered output. The output signal of the digital correction circuit 13a is input to the digital filter 16a through the delay circuit 15, and the output signal of the digital correction circuit 13b is input directly to the digital filter 16b. Assuming a transfer function of the digital filter 16a is Ha (z), and a transfer function of the digital filter 16b is H b(z).

Figure 9:
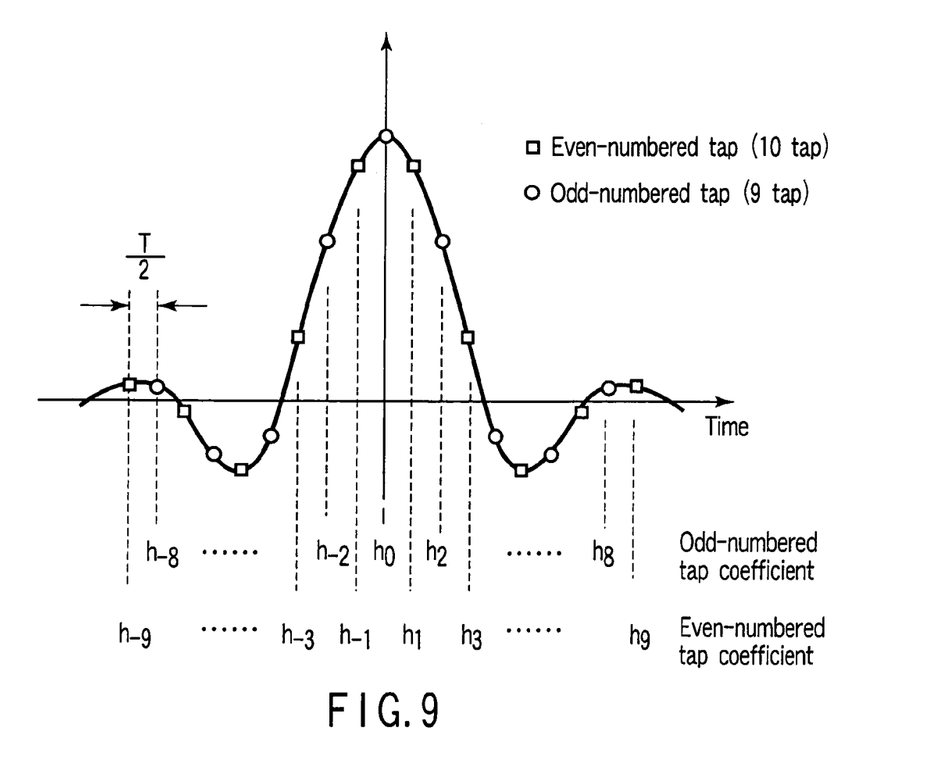
FIG. 9 is a diagram showing impulse responses of first and second digital filters.

FIG. 9 shows impulse responses of the digital filters 16a and 16b. The amplitude of vertical axis represents a value of the tap coefficient, and a horizontal axis indicates a time. The time difference between the even-numbered tap and the odd-numbered tap is $z^{-1/2}$ to be clear from FIGS. 7 and 8, namely the half clock period T/2. Since the output digital signals have peaks at the same timing by using such digital filters 16a and 16b, the relative deviation between delay times of the digital output signals Digital Out a and Digital Out b, that is, the deviation (ii) is corrected.

In the case of FIG. 6, when a digital signal output by the digital correction circuit 13a is delayed by the half clock period T/2 with the delay circuit 15 in the second unit AD converter 12a, the deviation between the output timings of the digital output signals Digital Out a and Digital Out b, that is, the deviation (i) is corrected. In this way, a digital filter having the larger number of taps than the other digital filter, in this example, the digital filter having the even number of taps is preferably applied to the digital output signal to be delayed by the half clock period T/2. When the digital filter having the even number of taps is larger in the number of taps, the digital filter with the odd number of taps is preferably applied to the digital output signal to be delayed by the half clock period T/2.

In a communications application, after an unnecessary component of a received signal is removed with a low pass filter of the analog circuit. Furthermore, a digital filter is well used to remove the unnecessary component in a digital processor. Accordingly, use of a digital filter for unnecessary component removal in the digital processor allows correction of the timing deviation of the digital output signal from the multiple input AD conversion apparatus. This allows enhancement of circuitry scale to be avoided.

Fifth Embodiment

There will be the fifth embodiment of the present invention using two-stage amplifier for an operational amplifier. The operational amplifiers A1 to A8 for the conversion stages ST1a to ST8a and ST1b to ST8b used in the first to fourth embodiments may be two-stage amplifiers. In that case, the two-stage structure operational amplifier may be shared between each of the conversion stages ST1a to ST8a of the first unit AD converter 12a and each of the conversion stages ST1b to ST8b of the second unit AD converter 12b, but only two-stage amplifiers are shared in a time sharing.

Figure 10:
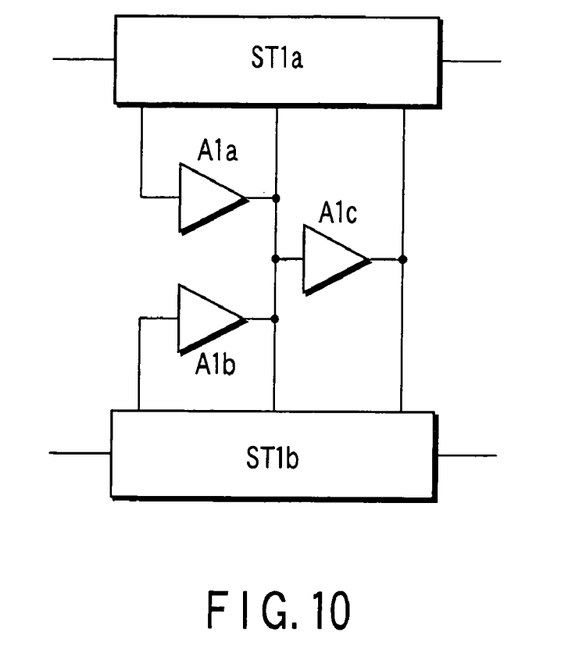
FIG. 10 is a block diagram of a two-stage operational amplifier used on a conversion stage in a multiple input analog-to-digital conversion apparatus concerning the fifth embodiment of the present invention.

FIG. 10 shows an example using two-stage amplifiers as the operational amplifiers for the conversion stages ST1a to ST8a and ST1b to ST8b, and shows only the conversion stages ST1a and ST1b. The first stage amplifiers A1a and A1b are used for the conversion stages ST1a and ST1b respectively, and the second stage amplifier A1c is shared between the conversion stages ST1a and ST1b in a time sharing. Similarly, only the two-stage amplifiers as the operational amplifiers is shared between other conversion stages ST2a to ST8a and stage S2b to ST8b in a time sharing. The first stage amplifiers A1a and A1b and the second stage amplifier A1c as the operational amplifier are illustrated outside the conversion stages ST1a and ST1b in FIG. 10. However, it configures a part of the components of the conversion stages ST1a and ST1b. In other words, the operational amplifier is fabricated integrally with the conversion stages ST1a and ST1b.

When the operational amplifier A0 used for the sample-and-hold circuit S/Ha in the first unit AD converter 12a and the sample-and-hold circuit S/Hb in the second unit AD converter 12b which are explained in, for example, the second embodiment is configured in a two-stage structure, only the second stage amplifier is shared therebetween in a time sharing.

Figure 11:
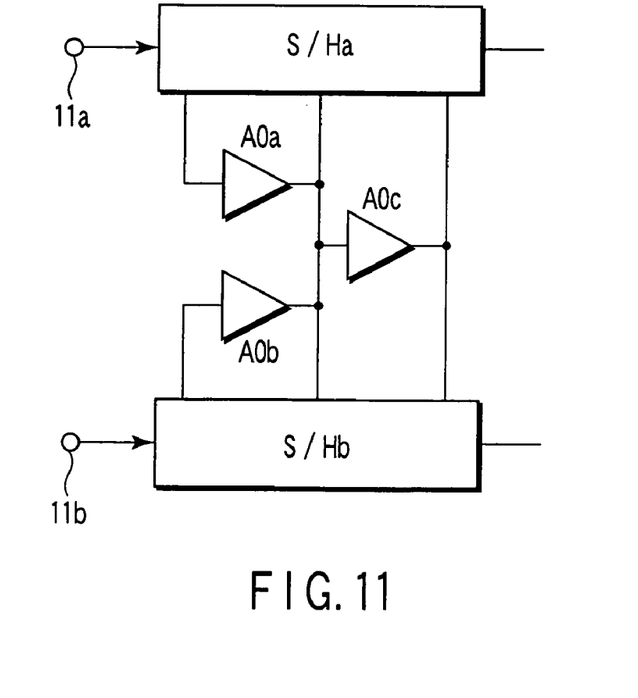
FIG. 11 is a block diagram of a two-stage operational amplifier used in a sample-and-hold circuit in the multiple input analog-to-digital conversion apparatus concerning the fifth embodiment of the present invention.

FIG. 11 shows an example using two-stage amplifiers as the operational amplifier for the sample-and-hold circuits S/Ha and S/Hb.

The first stage amplifiers A0a and A0b are used for the sample-and-hold circuits S/Ha and S/Hb individually, and the second stage amplifier A0c is shared between the sample-and-hold circuits S/Ha and S/Hb in a time sharing. The first stage amplifiers A0a and A0b and the second stage amplifier A0c as the operational amplifier are illustrated separated from the sample-and-hold circuits S/Ha and S/Hb in FIG. 11. However, the operational amplifier configures a part of the components of the sample-and-hold circuits S/Ha and S/Hb. In other words, the operational amplifier is fabricated integrally with the sample-and-hold circuits S/Ha and S/Hb.

In this way, when the operational amplifier is configured by a two-stage amplifier, conventionally, only the second stage amplifier of a larger power consumption is shared between the first unit AD converter and the second unit AD converter in a time sharing. As a result, the power consumption can be effectively reduced.

Sixth Embodiment

Figure 12:
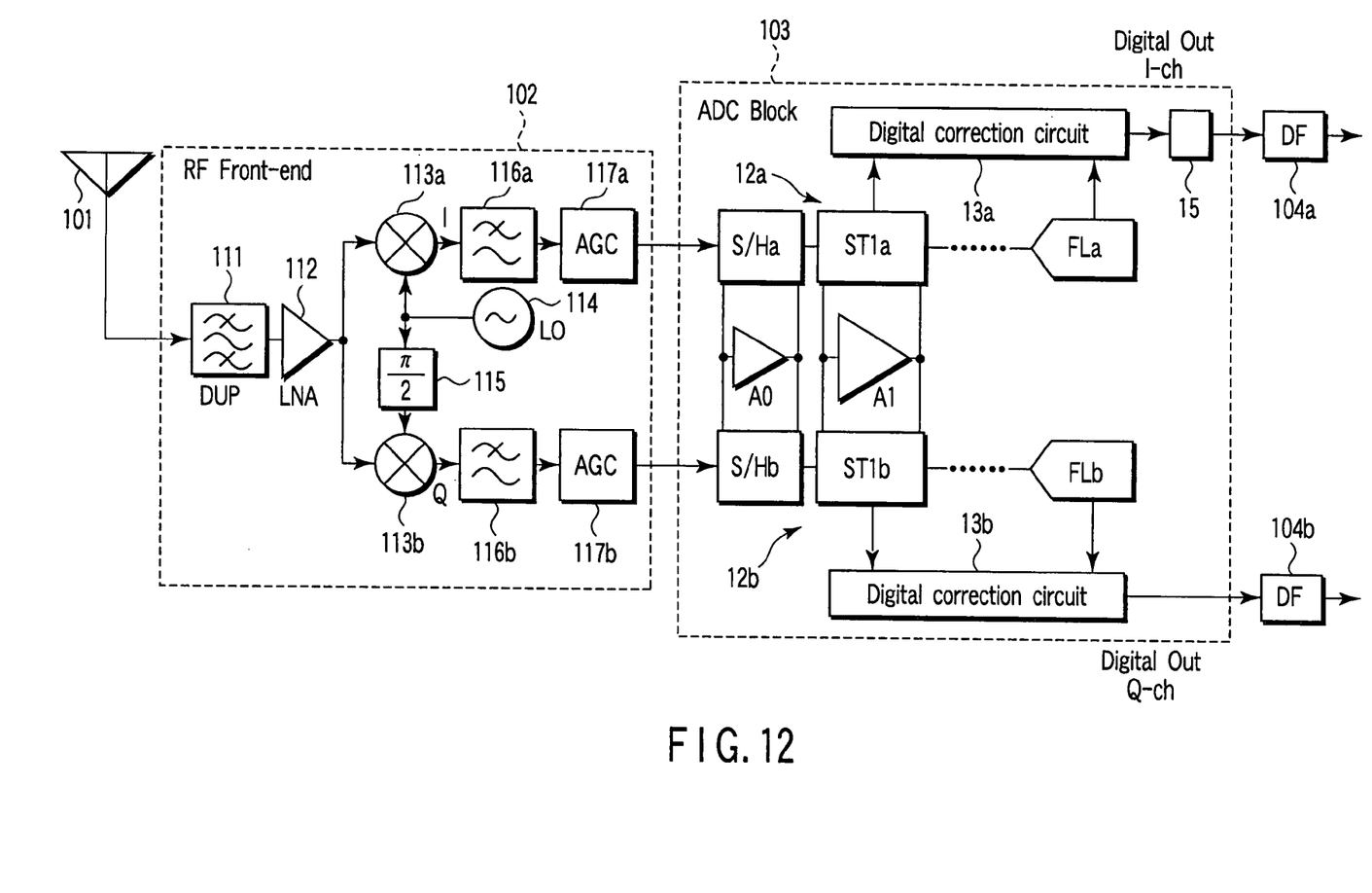
FIG. 12 is a block diagram of a radio receiver concerning the sixth embodiment of the present invention.

As the sixth embodiment of the present invention there will be described an example of applying the multiple input AD conversion apparatus explained above to a general radio receiver. FIG. 12 shows a radio receiver doing an orthogonal modulation/demodulation. The RF received signal output from an antenna 101 for receiving a radio wave is input to a RF front end 102. In the RF front end 102, the RF received signal from the radio antenna 101 is separated from a transmission system by a duplexer (in this example, a band pass filter) 111, and input to an orthogonal demodulator via a low noise amplifier 112.

The orthogonal demodulator comprises two mixers 113a and 113b, a local signal source 114 and a π/2 phase shifter 115, and demodulates the input RF received signal by the first and second local signals generated with a local signal source 114 and a π/2 phase shifter 115 and orthogonal to each other, to generate first and second baseband signals (I and Q channel signals) orthogonal to each other. The I and Q channel signals are filtered by low pass filters 116a and 116b respectively to remove unnecessary components therefrom, and adjusted in level by AGC circuits 117a and 117b, and then input to a ADC block 103.

The ADC block 103 is the multiple input AD conversion apparatus described above, and comprises unit AD converters 12a and 12b, digital correction circuits 13a and 13b and a delay circuit 15 as shown in FIG. 6. The ADC block 103 converts the input I and Q channel signals to digital output signals Digital Out I-ch and Digital Out Q-ch, respectively.

The digital output signals Digital Out I-ch and Digital Out Q-ch from the ADC block 103 are input to digital filters 104a and 104b respectively. The digital filters 104a and 104b use respectively the FIR filters shown in FIGS. 7 and 8, for example. Accordingly, the digital filters 104a and 104b not only remove unnecessary components but also correct a relative deviation between the delay times of the digital output signals Digital Out I-ch and Digital Out Q-ch, that is, the deviation (ii), occurring by correction of a timing deviation by the delay circuit 15.

In the case that the multiple input AD conversion apparatus based on the present invention converts the I and Q channel signals generated by orthogonal demodulation to a digital signal, if an operational amplifier is shared between two unit AD converters of a pipeline AD converter, the area and power consumption of the receiver are effectively reduced.

Seventh Embodiment

In recent years, a system of transceiver as referred to as MIMO (Multiple Input Multiple Output) attracts attention for improvement of a transmission rate. This is a system to perform transmitting and receiving by combination of a radio transmitter having a plurality of transmitting antennas with a radio receiver having a plurality of receiving antennas. This system can increase a transmission rate by transmitting and receiving information signals in parallel via a plurality of channels.

Figure 13:
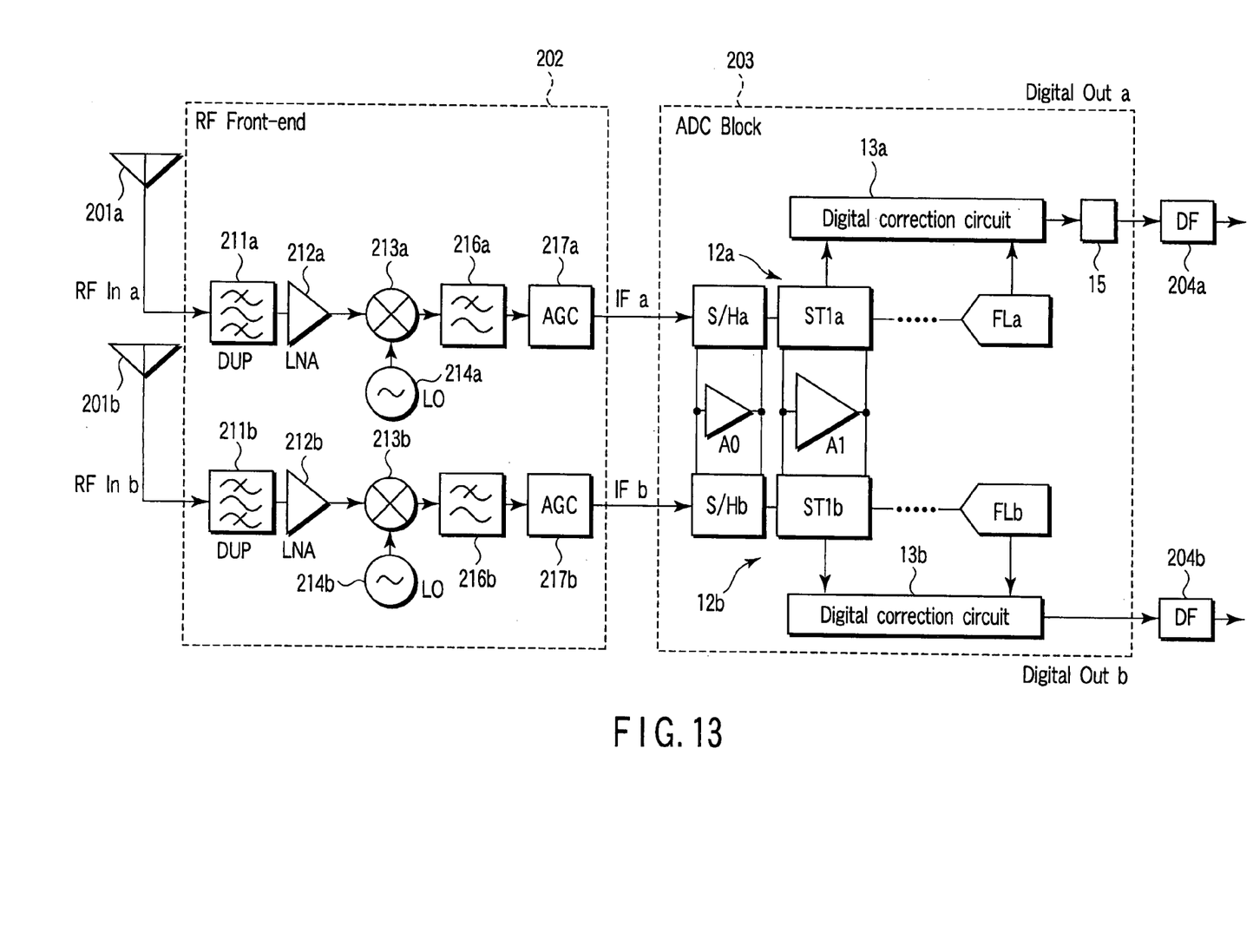
FIG. 13 is a block diagram of an MIMO radio receiver concerning the seventh embodiment of the present invention.

According to the seventh embodiment of the present invention, a problem of power consumption can be solved by applying the multiple input AD conversion apparatus to a radio receiver for MIMO. FIG. 13 shows a radio receiver for two-channel MIMO which has two receiving antennas 201a and 201b. The RF received signals output from the radio antennas 201a and 201b are input to a RF front end 202. In the RF front end 202, the RF received signals from the antennas 201a and 201b are separated from the transmitter system by duplexers (in this particular example, band pass filters) 211a and 211b, and amplified by low noise amplifiers (LNA) 212a and 212b.

The output signals from the LNAs 212a and 212b are input to mixers 213a and 213b and multiplied with local signals from local signal sources 214a and 214b, that is, frequency-converted (down-converted), so that IF (intermediate frequency) signals of two channels are generated. The IF signals are filtered by low pass filters 216a and 216b respectively to remove unnecessary components therefrom, and adjusted in level by AGC circuits 217a and 217b, and then input to a ADC block 203.

The ADC block 203 is the multiple input AD conversion apparatus described above, and comprises unit AD converters 12a and 12b, digital correction circuits 13a and 13b and a delay circuit 15 as shown in FIG. 6. The ADC block 203 converts the IF signals of two channels into digital output signals Digital Out a and Digital Out b respectively. The IF signals are input to the ADC block 203 in the embodiment, but may input a baseband signal to the ADC block.

The digital output signals Digital Out a and Digital Out b from ADC block 203 are input to digital filters 204a and 204b respectively. The digital filters 204a and 204b not only remove unnecessary components but also correct a relative deviation between the delay times of the digital output signals Digital Out I-ch and Digital Out Q-ch, that is, the deviation (ii), occurring with correction of a timing deviation by the delay circuit 15.

As another embodiment of the present invention, the present invention can apply to a radio receiver of a radio communication system combining a MIMO with orthogonal modulation and demodulation. Combination of the MIMO with the orthogonal modulation and demodulation needs two AD converters per one radio antenna in the radio receiver. The whole radio receiver needs AD converters of 2×the number of MIMO channels, resulting in increasing power consumption. In contrast, if the radio receiver shown in FIG. 13 is applied to each MIMO channel, the number of operational amplifiers can be minimized by providing multiple input AD conversion apparatuses corresponding in number to the MIMO channels, resulting in being effective for reduction of power consumption.

In the multiple input AD conversion apparatus concerning the present invention, analog signal inputs of a plurality of channels are assumed, and a plurality of pipeline-shaped unit AD converters are arranged, an area of an operational amplifier and power consumption thereof can be reduced one-half by sharing an operational amplifier to be used for a sample-and-hold circuit of each unit AD converter and an operational amplifier to be used for a conversion stage of each unit AD converter.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple input AD conversion apparatus which converts a first analog input signal and a second analog input signal to a first digital output signal and a second digital output signal respectively, the multiple input AD conversion apparatus comprises: a first unit AD converter including a plurality of first conversion stages connected in cascade to convert the first analog input signal to the first digital output signal; a second unit AD converter including a plurality of second conversion stages connected in cascade to convert the second analog input signal to the second digital output signal; a plurality of operational amplifiers each configured to be shared between a corresponding first conversion stage of the first conversion stages and a corresponding second conversion stage of the second conversion stages in a time sharing; and a first timing correction circuit and a second timing correction circuit which are arranged on output sides of the first unit AD converter and the second unit AD converter respectively to correct a timing deviation between output timings of the first digital output signal and the second digital output signal respectively, the first timing correction circuit comprises a delay circuit to correct the deviation of the output timing and a first digital filter having n taps (n is integer), and the second timing correction circuit comprises a second digital filter having (n−1) taps. and the first digital filter and the second digital filter have an approximately identical impulse response.

2. The apparatus according to claim 1, wherein each of the operational amplifiers includes a first stage amplifier and a second stage amplifier shared between the first conversion stage and the second conversion stage.

3. The apparatus according to claim 1, wherein the operational amplifiers decrease in area toward rear stage of the conversion stages.

4. A multiple input AD conversion apparatus which converts a first analog input signal and a second analog input signal to a first digital output signal and a second digital output signal respectively, the multiple input AD conversion apparatus comprises: a first unit AD converter including a first sample-and-hold circuit to sample and hold the first analog input signal and a plurality of first conversion stages connected in cascade to a rear stage of the first sample-and-hold circuit to convert the first analog input signal to the first digital output signal; a second unit AD converter including a second sample-and-hold circuit to sample and hold the second analog input signal and a plurality of second conversion stages connected in cascade to a rear stage of the second sample-and-hold circuit, and converts the second analog input signal to the second digital output signal; a plurality of first operational amplifiers each configured to be shared between a corresponding first conversion stage of the first conversion stages and a corresponding second conversion stage of the second conversion stages in a time sharing; and a second operational amplifier configured to be shared between the first sample-and-hold circuit and the second sample-and-hold circuit in a time sharing.

5. The apparatus according to claim 4, wherein the first operational amplifier includes a first stage amplifier and a second stage amplifier shared between the first conversion stage and the second conversion stage.

6. The apparatus according to claim 4, wherein the second operational amplifier includes a first stage amplifier and a second stage amplifier shared between the first sample-and-hold circuit and the second sample-and-hold circuit.

7. The apparatus according to claim 4, wherein the first sample-and-hold circuit performs a sample operation in a first period and a hold operation in a second period, and the second sample-and-hold circuit performs a sample operation in the first period and a hold operation in the second period.

8. The apparatus according to claim 4, which further comprises first and second timing correction circuits arranged on output sided of the first unit AD converter and the second unit AD converter respectively to correct a timing deviation between output timings of the first digital output signal and the second digital output signal respectively.

9. The apparatus according to claim 8, wherein the first timing correction circuit comprises a delay circuit to correct the deviation of the output timing and a first digital filter having n taps (n is integer), the second timing correction circuit comprises a second digital filter having (n−1) taps, and the first digital filter and the second digital filter has an approximately identical impulse response.

10. The apparatus according to claim 4, wherein the first operational amplifiers decrease in area toward rear stage of the conversion stages.

* * * * *